United States Patent [19]

Bohac, Jr.

[11] Patent Number: 4,734,599
[45] Date of Patent: Mar. 29, 1988

[54] CIRCUIT FOR MULTIPLYING A PUMP CLOCK VOLTAGE

[75] Inventor: Frank J. Bohac, Jr., Laguna Hills, Calif.

[73] Assignee: Hughes Aircraft Company, Los Angeles, Calif.

[21] Appl. No.: 728,731

[22] Filed: Apr. 30, 1985

[51] Int. Cl.[4] .......................... H03K 5/01; H03K 4/24
[52] U.S. Cl. ..................................... 307/497; 307/110; 307/529; 307/264; 328/160
[58] Field of Search ............... 307/110, 529, 497, 264, 307/362, 363, 482, 578; 328/160

[56] References Cited

U.S. PATENT DOCUMENTS

| | | | |
|---|---|---|---|
| 3,975,671 | 8/1976 | Stoll | 321/15 |
| 4,382,194 | 5/1983 | Nakano et al. | 307/264 |
| 4,398,100 | 8/1983 | Tobita et al. | 307/264 |
| 4,485,433 | 11/1984 | Topich | 363/60 |

Primary Examiner—Stanley D. Miller
Assistant Examiner—Richard Roseen
Attorney, Agent, or Firm—Kenneth W. Float; A. W. Karambelas

[57] ABSTRACT

A voltage multiplier circuit is disclosed. The circuit comprises three p-channel MOS transistors and three capacitors. When these elements are connected to properly phased transfer and pump clock signals of positive polarity, the circuit generates a negative output voltage which is roughly equal in magnitude to the peak-to-peak voltage of the pump clock. One of the transistors couples the output node to the circuit input node, and is clocked by the transfer clock so as to isolate the input node from the output node when the output node potential is lower than the input node potential. Several of the circuits may be cascaded to produce a large negative supply from a small positive supply. The circuit is advantageously employed to provide the programming signal supply for EEPROM devices.

22 Claims, 10 Drawing Figures

CIRCUIT FOR MULTIPLYING A PUMP CLOCK VOLTAGE

BACKGROUND OF THE INVENTION

The present invention relates to voltage multiplier circuits, and more particularly to voltage pump circuits employed in integrated circuits such as electrically erasable programmable read only memories (EEPROMs).

EEPROM devices typically employ floating gate transistors, programmed either to the depletion or enhancement mode, as the memory elements. To program the elements, a high programming voltage, typically about 17 volts, is required to induce electron tunneling to or from the floating gate. If the device is to be operated from a +5 volt supply, a circuit is required to generate an additional 12 volts. This supply circuit should also be capable of charging the large memory circuit capacitance in less than the element programming time (typically 1 millisecond).

It is known in CMOS technology to use inverting circuits comprising N channel transistors and capacitors, wherein the capacitors are charged in parallel and then connected in series to achieve voltage multiplication. The N channel transistors require P wells, which leads to several disadvantages, i.e., more chip area for an equivalent stage, less efficiency due to parasitic capacitance and an undesirable parasitic bipolar NPN device. The P wells typically require more separation between stages and therefore require a larger chip area to maintain an equivalent output current. The P wells introduce a parasitic capacitance which may be charged and discharged each cycle, thereby reducing efficiency. The possibility of latch-up is introduced by the addition of a bipolar NPN device. This is a serious disadvantage to newer processes which are more sensitive to latch-up.

Charging all the capacitors in parallel and then connecting them in series has the disadvantage that both nodes of the pumping capacitors are included in the output. Since the lower plate of the capacitor also has a parasitic capacitor coupled to its substrate, the charge is split between these two capacitors. The charge lost to the parasitic capacitor subtracts directly from the output current of the circuit. This leads to a lower output current per unit area and to a lower open circuit output voltage and lower output current per unit area. The charge splitting losses are process dependent, which leads to lot-to-lot variations in output voltage and current.

It would therfore be an advance in the art to provide a voltage multiplier circuit with a very high efficiency which is less process dependent. It would further by advantageous to provide a voltage multiplier with increased layout density and current drive capability, and in which the possibility of latch-up has been eliminated.

SUMMARY OF THE INVENTION

A voltage multiplier circuit with a pump clock coupled to the circuit output node by a pump capacitor is disclosed. In accordance with the invention, the output node is coupled to the input node by a switching means comprising a transistor whose control gate is capacitively coupled to a transfer clock. The transistor is periodically gated to the conductive state when the pump clock is at its high state, i.e., when the potential at the output node is greater than the potential at the input node. This allows the potential to equalize between the two nodes, and results in charge transfer between the outpt node and the input node.

Several stages can be cascaded together to generate a large negative voltage from a clock signal of positive polarity, for example, to develop the programming voltage for an integrated circuit such as an EEPROM. The transistor elements for the circuit are preferably p-channel enhancement mode devices. The input node of the first stage is coupled to ground, and the output node is coupled to the input node of the next stage. A rectifying stage is coupled to the output node of the final stage. To increase the maximum clock rate and the current supply capability of the circuit, each stage is provided with a means to reset the DC bias on the gate of the transistor to the input node potential. In such a multi-stage circuit, the peak-to-peak voltage of the pump clock is multiplied by approximately the number of stages in the circuit.

First and second non-overlapping pump and transfer clocks, 180° out of phase, are provided to drive alternate stages of the cascaded multiplier circuit. This ensures that the switching transistors of adjacent stages are not in the conductive state at the same time.

BRIEF DESCRIPTION OF THE DRAWINGS

These and other features and advantages of the present invention will become more apparent from the following detailed description of an exemplary embodiment thereof, as illustrated in the accompanying drawings, wherein like reference numerals and designations represent like structural elements, and in which.

DETAILED DESCRIPTION OF THE PREFERRED EMBODIMENT

The present invention comprises a novel voltage multiplier. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications. Thus, the present invention is not intended to be limited to the embodiment shown, but is to be accorded the widest scope consistent with the principles and novel features disclosed herein.

Figure 10:
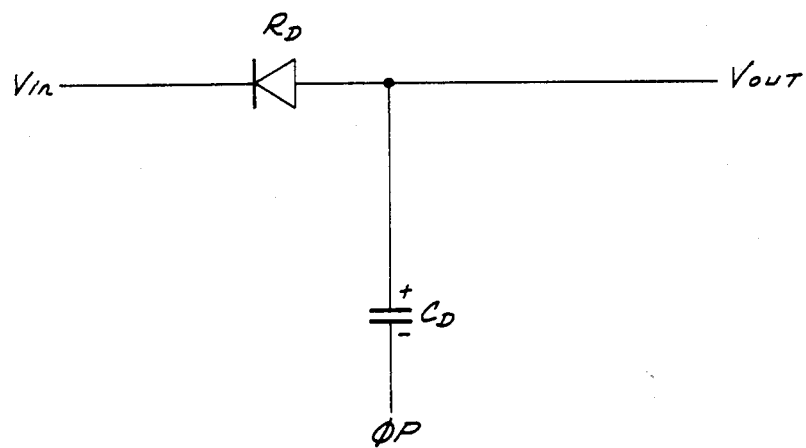
FIG. 10 is a schematic diagram of a known discrete voltage multiplier circuit.

To illustrate the advance in the art presented by the invention, it is useful to discuss the operation of a known discrete voltage multiplier circuit (FIG. 10).

The circuit comprises a diode rectifier $R_D$ coupled cathode to anode between the circuit input node and its output node, and a pump capacitor $C_D$ coupling the output node to a pump clock signal. The input voltage $V_{in}$ to the circuit is applied at the input node, and the circuit output voltage $V_{out}$ is taken at its output node. The pump clock is a square wave signal having a low state (0 volts) and a high state ($+V_{DD}$ volts).

For discussion purposes, it is assumed that the circuit input node (FIG. 10) is grounded and $V_{out}$ is initially 0 volts. At time $T_1$, the pump clock signal pulses high to $V_{DD}$. The voltage $V_{out}$ is capacitively coupled to $+V_{DD}$, but decays through the forward biased rectifier diode $R_D$ to ground, charging capacitor $C_D$ to $-V_{DD}$. At time $T_2$, the pump clock signal pulses low, the voltage $V_{out}$ is coupled to $-V_{DD}$ and $R_D$ is reverse biased to the non-conductive state, preventing $C_D$ from discharging. $V_{out}$ is now about equal to $V_{in} - V_{DD}$.

If a second circuit stage is connected to the first stage output node and clocked to the high state while the first stage pump clock signal is low, its output will be at about $V_{in} - 2V_{DD}$. Thus, each stage has a charge pumping capacitor $C_D$ which couples the pump clock signal to the output node. When a positive voltage with respect to $V_{in}$ occurs at $V_{out}$, $C_D$ is charged through the rectifier $R_D$ to $V_{IN} - V_{DD}$. When the pump clock signal transitions to its low level, $V_{out}$ is coupled to $V_{in} - V_{DD}$.

With a complimentary-metal-oxide process presently employed by the assignee of the invention to fabricate EEPROM devices, the available diodes either have one terminal tied to a supply voltage or contain a parasitic bipolar NPN transistor that conducts large currents when the diode is forward biased. For these reasons, the available diodes may not be used as the rectifier element for the voltage multiplier circuit.

In accordance with the invention, the rectifier is replaced by a circuit employing a clocked transistor, to perform a function analogous to that performed by the rectifier. In accordance with the invention, the transfer clock is capacitively coupled to the gate of the rectifying transistor, and the D.C. voltage applied to the gate is reset between each cycle. Thus, the rectifying transistor is clocked by a transfer clock with high and low levels adapted to turn the transfer on or off, irrespective of the degree of negative potential at node $V_{in}$.

The transfer clock signal states are preferably at ground and the positive supply level ($V_{DD}$). A novel aspect of the invention is that the rectifying transistor is gated to the conductive and nonconductive states by a transfer clock signal with states at ground and the supply potential, even though the output node may be substantially more negative than the supply potential.

Figure 1:
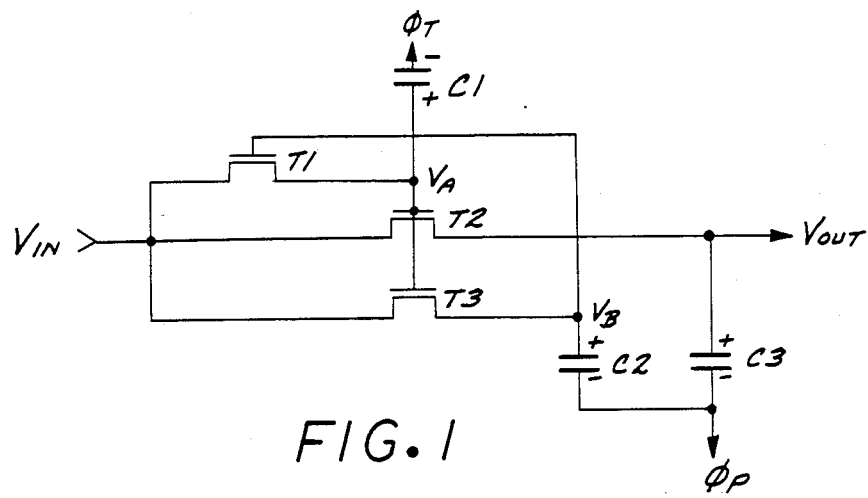
FIG. 1 is a circuit schematic of a preferred embodiment of the invention.

Referring now to FIG. 1, capacitor C3 serves as a voltage pumping capacitor. Transistor T2 comprises a rectifier device. The circuit is connected to two clocks signal, a transfer clock signal $\phi_t$ and the pump clock signal $\phi_p$. Capacitor C1 couples the transfer clock signal to the gates of transistors T2 and T3. Capacitors C2 and C3 are adapted to couple the pump clock signal $\phi_p$ to the gate of transistor T1 and to node $V_{OUT}$.

The transistors T1, T2, and T3 are p-channel enhancement mode devices. In order for these devices to be in the conductive state, the gate potential must be lower than either the drain or source potential by at least a threshold voltage, on the order of 1 volt.

Transistor T1 is coupled between the gate of transistors T2 and node $V_{IN}$ and provides a means for selectively resetting the voltage at node $V_A$, the gate potential for transistor T1, and $V_{IN}$, thus providing a D.C. reference for node $V_A$.

Transistor T3 is coupled between the node $V_{IN}$ and the node $V_B$. This provides a means of resetting the gate voltage of transistor T1 ($V_B$) to $V_{IN}$, i.e., providing $V_B$ with a D.C. reference.

To describe the operation of the circuit, it is assumed that $V_A$, $V_B$ and $V_{OUT}$ are at potential $V_{IN}$. At time $t_o$, illustrated in FIG. 2, $\phi_p$ is low (0 volts) and $\phi_t$ is high ($+V_{DD}$). Since all three node voltages are at equal potential, all three transistors T1, T2, T3 are turned off.

At time $t_1$, the pump clock signal $\phi_p$ pulses high. This voltage change is coupled to node $V_{OUT}$ and to node $V_B$ via capacitors C3 and C2, respectively. Since the potential at node $V_A$ is less than the potential at node $V_{OUT}$, the p-channel enhancement transistor T2 turns on and charges capacitor C3 toward $-(V_{DD} - V_{IN})$. When $V_{OUT}$ reaches a potential equivalent to a threshold voltage above the potential at node $V_A$, transistor T2 turns off.

At time $t_2$, the transfer clock signal $\phi_t$ pulses low. This pulse is coupled to node $V_A$ through capacitor C1 and turns on transistor T2, allowing capacitor C3 to completely charge to $-(V_{DD} - V_{IN})$. Capacitor C2, transistor T3 and $V_B$ operate in a similar manner, so that capacitor C2 is charged to $-(V_{DD} - V_{IN})$.

At time $t_3$, after the capacitors C2 and C3 have charged to $-(V_{DD} - V_{IN})$, the transfer clock signal $\phi_t$ pulses high, which turns off the transistors T2 and T3.

At time $t_4$, the pump clock signal $\phi_p$ pulses low, pulling the potential at the nodes $V_{OUT}$ and $V_B$ to $-(V_{IN} - V_{DD})$.

If the external load on the circuit is resistive, capacitor C3 will discharge during the time interval between times $t_4$ and $t_5$. Node $V_B$ is isolated from the load, and hence its potential stays constant during this time interval. The current capacity of the circuit is increased due to the isolation of $V_B$ from the load, as will be discussed in more detail below. Since the voltage at $V_B$ is less than the voltage at $V_{IN}$, T1 is turned on, resetting $V_A$ to $V_{IN}$ while the pump clock signal $\phi_p$ is low. This in turn maintains transistors T2 and T3 in the nonconductive state.

The next cycle starts at time $t_5$ when the pump clock signal $\phi_p$ pulses high. This pulse is coupled to node $V_B$ through the capacitor C2, raising the voltage at node $V_B$ from $-(V_{DD} - V_{IN})$ to $V_{IN}$ volts. This turns transistor T1 off, isolating node $V_A$ from node $V_{IN}$ so that the potential at node $V_A$ can be pulsed low by the transfer clock signal $\phi_t$ at time $t_6$.

With the pump clock signal $\phi_p$ at $+V_{DD}$, the node $V_{OUT}$ will be coupled at a positive voltage with respect to the potential at node $V_{IN}$. The potential difference between the two nodes is determined by the amount that capacitor C3 discharged in the time interval between $t_4$ and $t_5$. If the amount of discharge between cycles is small, the potential at node $V_{OUT}$ will be slightly more positive than the potential at node $V_{IN}$, and transistor T2 will not turn on until time $t_6$, when the transfer clock signal $\phi_t$ pulses low. From this point on, the operation of the circuit repeats.

By using only p-channel enhancement mode active devices in the circuit, the layout density is increased, since no wells are required, the fabrication process is simplified, and ther are no parasitic vertical NPN bipolar transistors, thus eliminating the possibility of latch-up.

Figure 9:
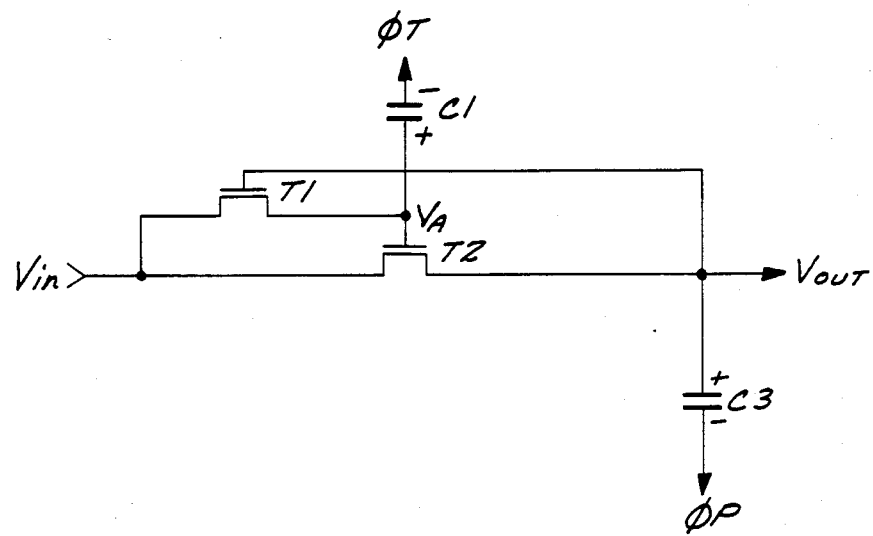
FIG. 9 is a circuit schematic of an alternate embodiment of the invention.

In an alternative arrangement, the transistor T3 and capacitor C2 may be omitted from the circuit, and the base of transistor T1 coupled directly to the node $V_{OUT}$ in FIG. 9 as illustrated in FIG. 1. The circuit will perform satisfactory with these modifications, and in fact the operation is identical when the circuit operation is at steady state with no resistive loading or when operated with a very low rate clock. However, the advantage of employing the more complex circuit of FIG. 1, with its isolation of the control node $V_A$ from the output node $V_{OUT}$, is that the circuit may be clocked at a faster rate than if the node $V_A$ were simply coupled directly to the node $V_{OUT}$.

With the gate of the transistor coupled directly to the node $V_{OUT}$, as charge is transferred into the node $V_{OUT}$, in FIG. 9 the potential at node $V_{OUT}$ rises, lessening the gate drive on the transistor T1. As a result, the DC bias on the gate of the rectifying transistor T2 does not get reset to the potential at node $V_{IN}$. This in turn reduces the gate drive on transistor T2 so that there is more resistance in the source-drain channel, slowing down the transfer of charge from node $V_{OUT}$ to node $V_{IN}$.

The operation of the transistor T3 and the capacitor C2 in the circuit of FIG. 1 mimics that of the transistor T2 and the capacitor C3, except that the capacitor C2 is not coupled to the load at node $V_{OUT}$, and therefore is not discharged under DC load conditions. With the capacitor C3 fully charged, the drive on the transistor T1 is maintained, keeping the transistor in the conductive state and allowing the node $V_A$ to discharge to the potential at the node $V_{IN}$ much more quickly under loaded conditions than if the gate of transistor T1 were driven by the potential at node $V_{OUT}$.

It has been found that employing the transistor T3 and capacitor C2 (FIG. 1) to isolate the rectifier control node from the load allows the clock rate to be increased by as much as 50%. Increasing the clock rate in turn increases the current sinking capability of the circuit.

Figure 3:
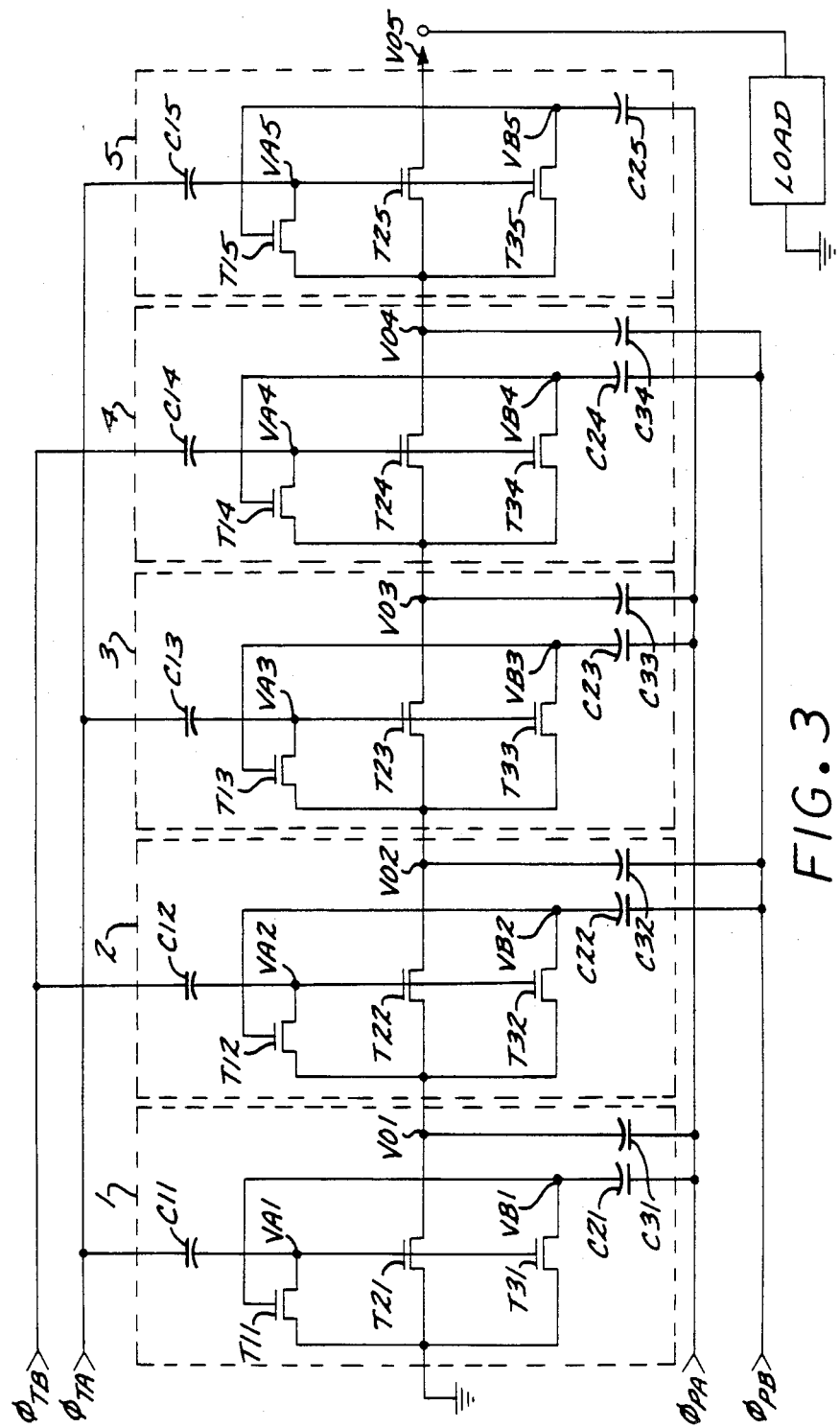
FIG. 3 is a circuit schematic illustrating a four stage voltage multiplier circuit in accordance with the invention.

Several circuits similar to the circuit shown in FIG. 1 may be cascaded together, as shown in FIG. 3, to produce a large negative voltage by inverting and multiplying a small positive supply voltage, e.g., $V_{DD}$. Each stage of the multiplier circuit comprises six devices, the three capacitors C1N, C2N and C3N, and three p-channel MOS transistors. Thus, stage 1 through 4 add in series to generate a negative voltage about equal to four times the peak to peak voltage of the clock signals. The last stage 5 acts as a rectifier stage, isolating V04 from V05 when V04 is more positive than V05. The rectifier stage 5 is identical to stages 1–4, except that the pumping capacitor C3N for the stage is omitted. The four stages are alternately connected to the sources of pump and transfer clock signals $\phi_{PA}$, $\phi_{PB}$, $\phi_{TA}$, $\phi_{TB}$, which are respectively 180° out of phase, as shown in FIGS. 4A–4D.

Figure 2:
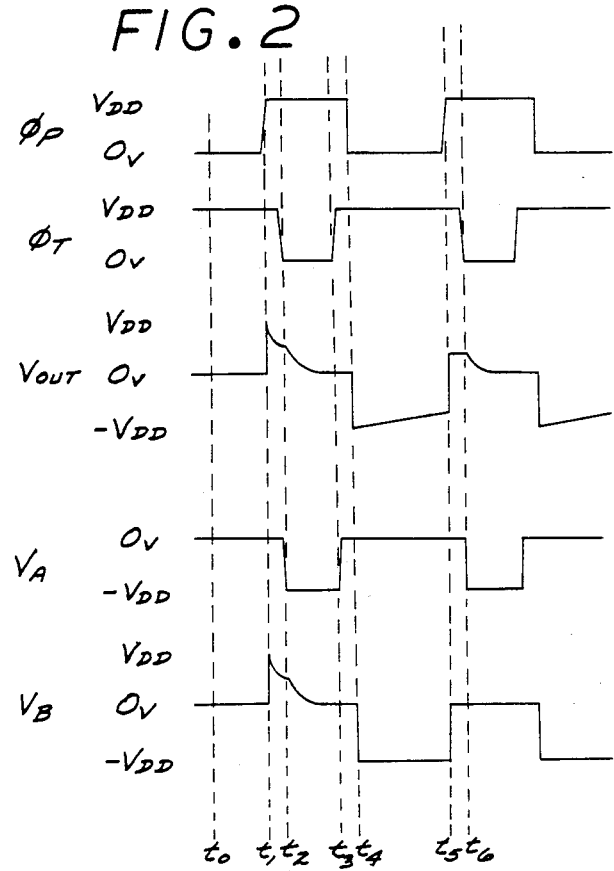
FIG. 2 is a signal waveform diagram illustrating pertinent node voltages of the circuit shown in FIG. 1, as a function of the circuit clock signals.

When several stages are cascaded as shown in FIG. 3, in only the first stage is the node $V_{IN}$ grounded. The input node $V_{IN}$ for each of the following stages is coupled to the $V_{OUT}$ node of the previous stage and, thus, will have a waveform similar to $V_{OUT}$ as shown in FIG. 2. FIG. 3 shows stages 1–4 and the rectifier stage 5. The output node of stage 1 is indicated as V01, stage 2 as V02, stage 3 and V03, stage 4 as V04, and the rectifier stage 5 as V05. The rectifying transistor of stage N is indicated as transistor T2N; a similar convention is employed to indicate elements and circuit nodes for each stage which correspond to like elements in the single stage circuit of FIG. 1.

FIG. 4E illustrates the steady-state signal wave-forms of the output nodes V0N at each stage of the cascaded circuit of FIG. 3, with no resistive load on the circuit output V05. Since the clock signals are capacitively coupled to the respective stages, the circuit operation is essentially the same as described above with respect to the single stage circuit shown in FIG. 1.

FIGS. 4A–4D are waveform timing diagrams of the transfer clock signals $\phi_{TA}$ and $\phi_{TB}$ and the pump clock signals $\phi_{PA}$ and $\phi_{PB}$. The transfer clock signals $\phi_{TA}$ and $\phi_{TB}$ are non-overlapping clock signals in that neither clock is high at the same time the other clock signal is high. Similarly, the pump clock signals $\phi_{PA}$ and $\phi_{PB}$ are non-overlapping signals. Circuits to generate these types of non-overlapping clock signals are known in the art, and for that reason are not described herein.

When the output node V0(N−1) of the previous stage is pulsed high, the rectifying transistor T2N remains turned off because the transistor T1N holds the gate of the rectifying transistor T2N at the input voltage to the stage at node V0(N−1).

FIG. 5E illustrates the waveforms at the control nodes VAN for the cascaded circuit of FIG. 3 under the same conditions as apply to the FIG. 4E waveforms, namely, steady-state and no resistive load.

Figure 6:
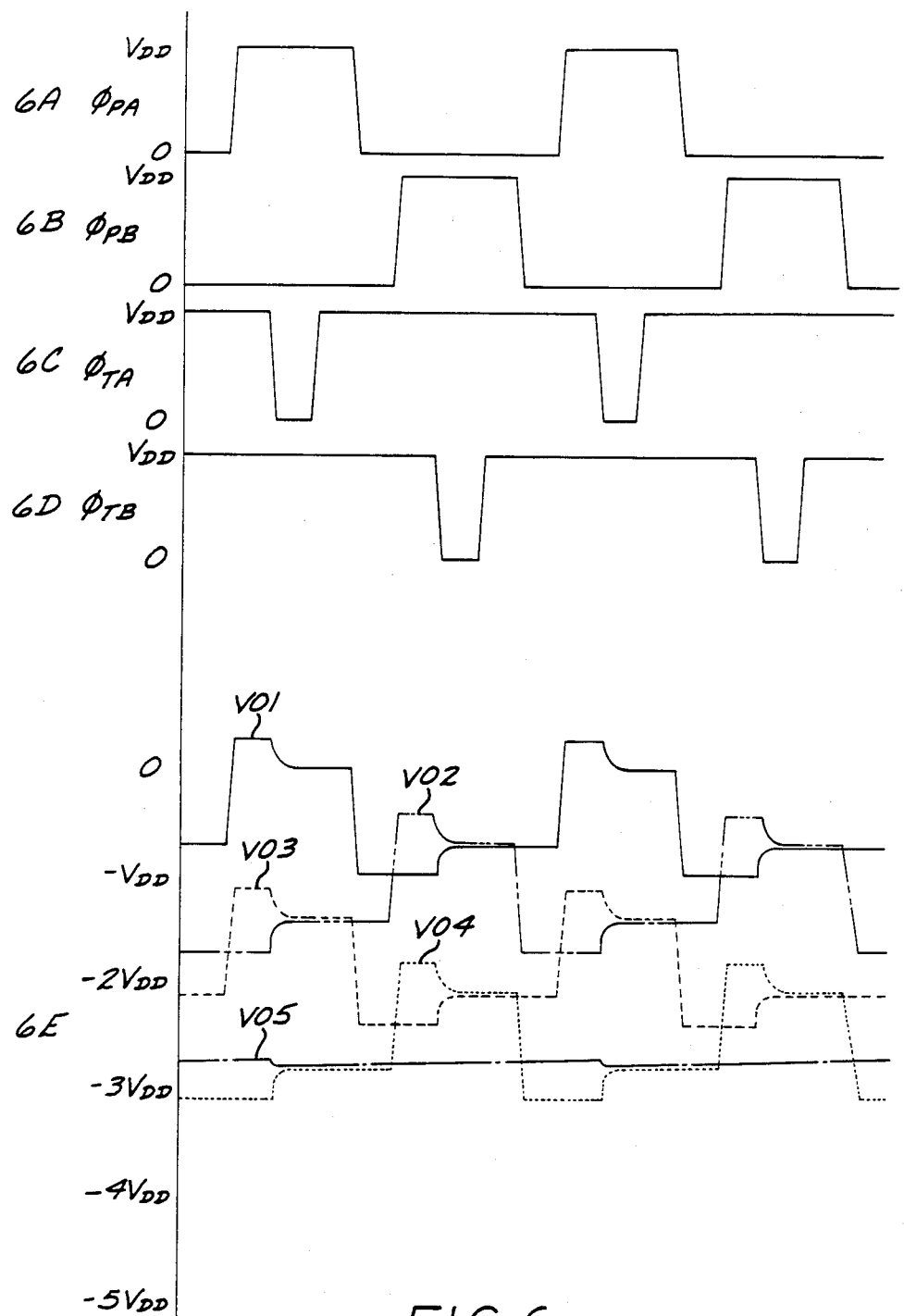
FIGS. 6A–6E, 7A–7E and 8A–8E plot the clock and pertinent signal waveforms for the four-stage circuit of FIG. 3 under steady-state, resistive load conditions.
Figure 7:
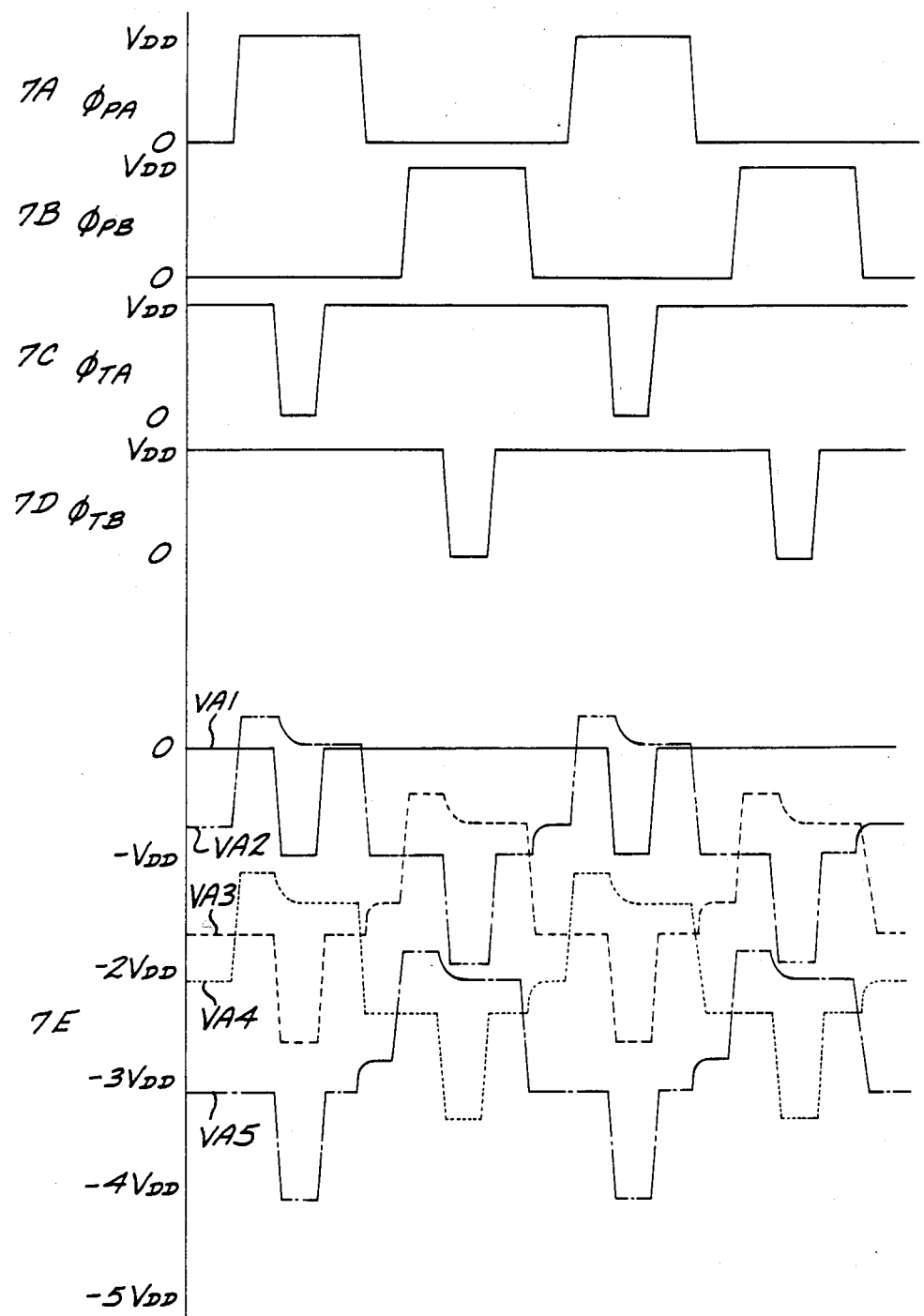
Figure 8:
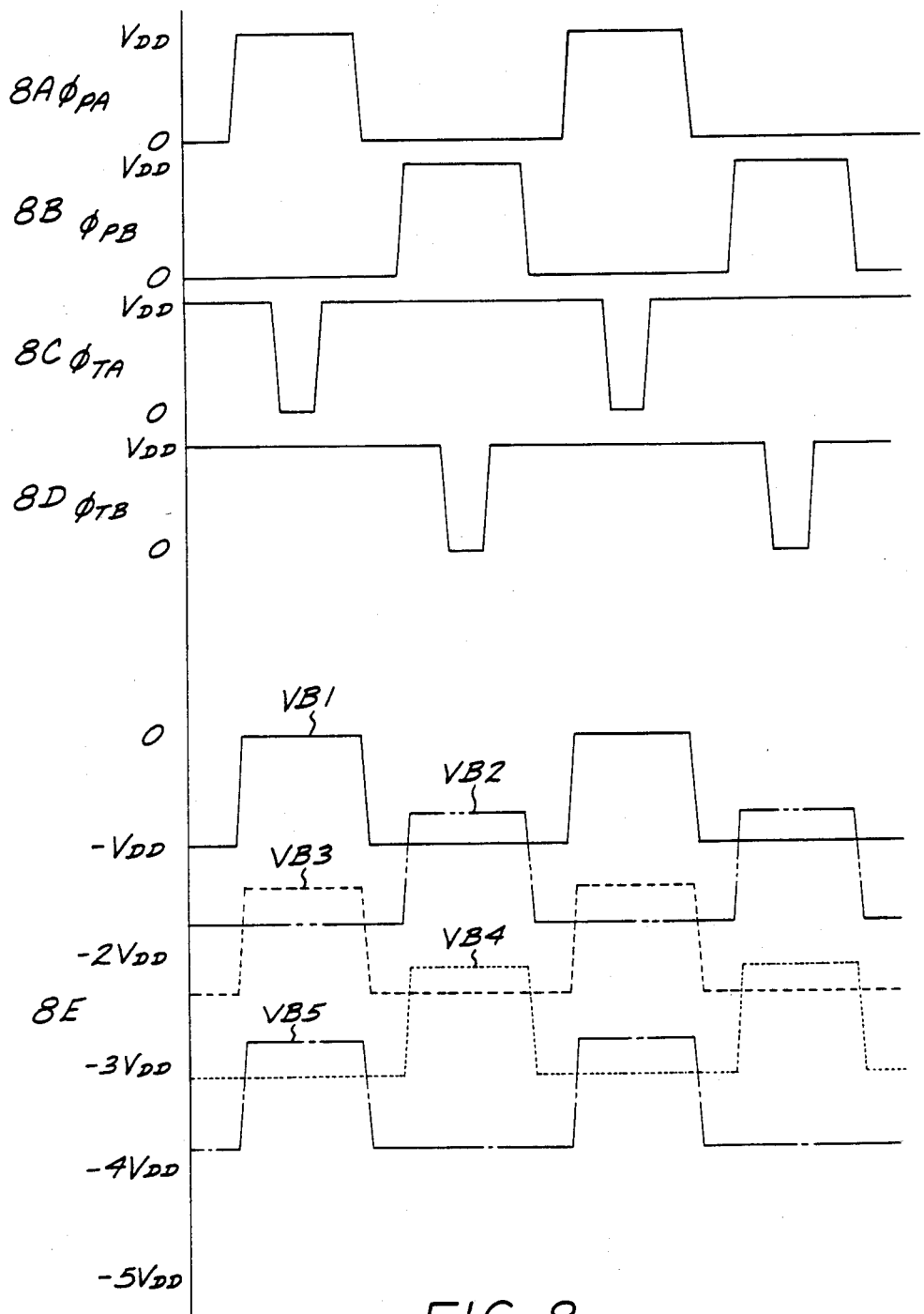

FIGS. 6E, 7E and 8E illustrate, respectively, the waveforms at the output nodes V0N, nodes VAN and the nodes VBN for the cascaded circuit of FIG. 3, under steady-state, resistive load conditions.

For clarity, the transfer and pump clock signals are reproduced in FIGS. 5A–5D, 6A–6D, 7A–7D and 8A–8D.

Figure 4:
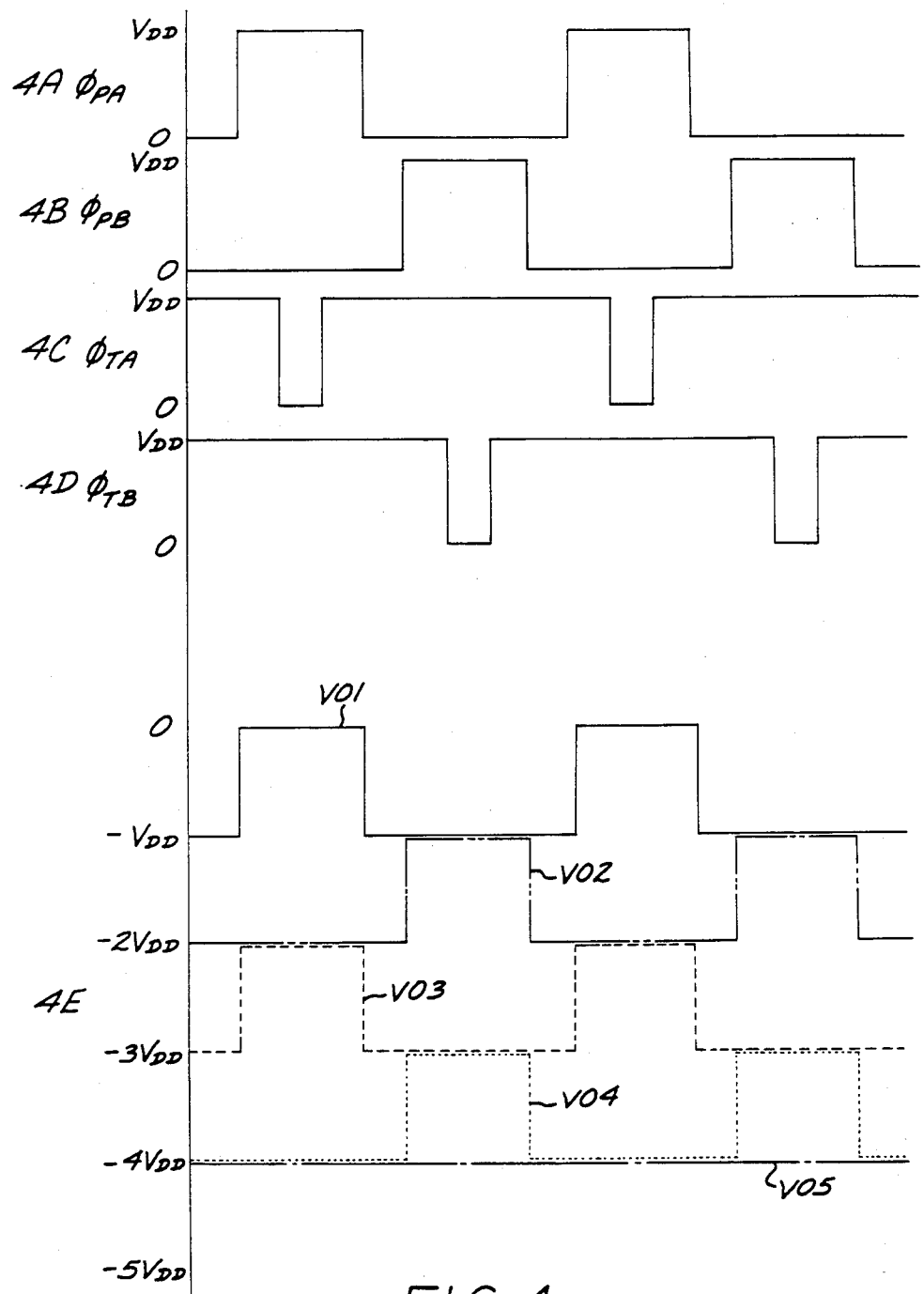
FIGS. 4A–4E and 5A–5E plot the clock and pertinent signal waveforms for the four-stage circuit of FIG. 3 under steady-state, non-loaded conditions.
Figure 5:
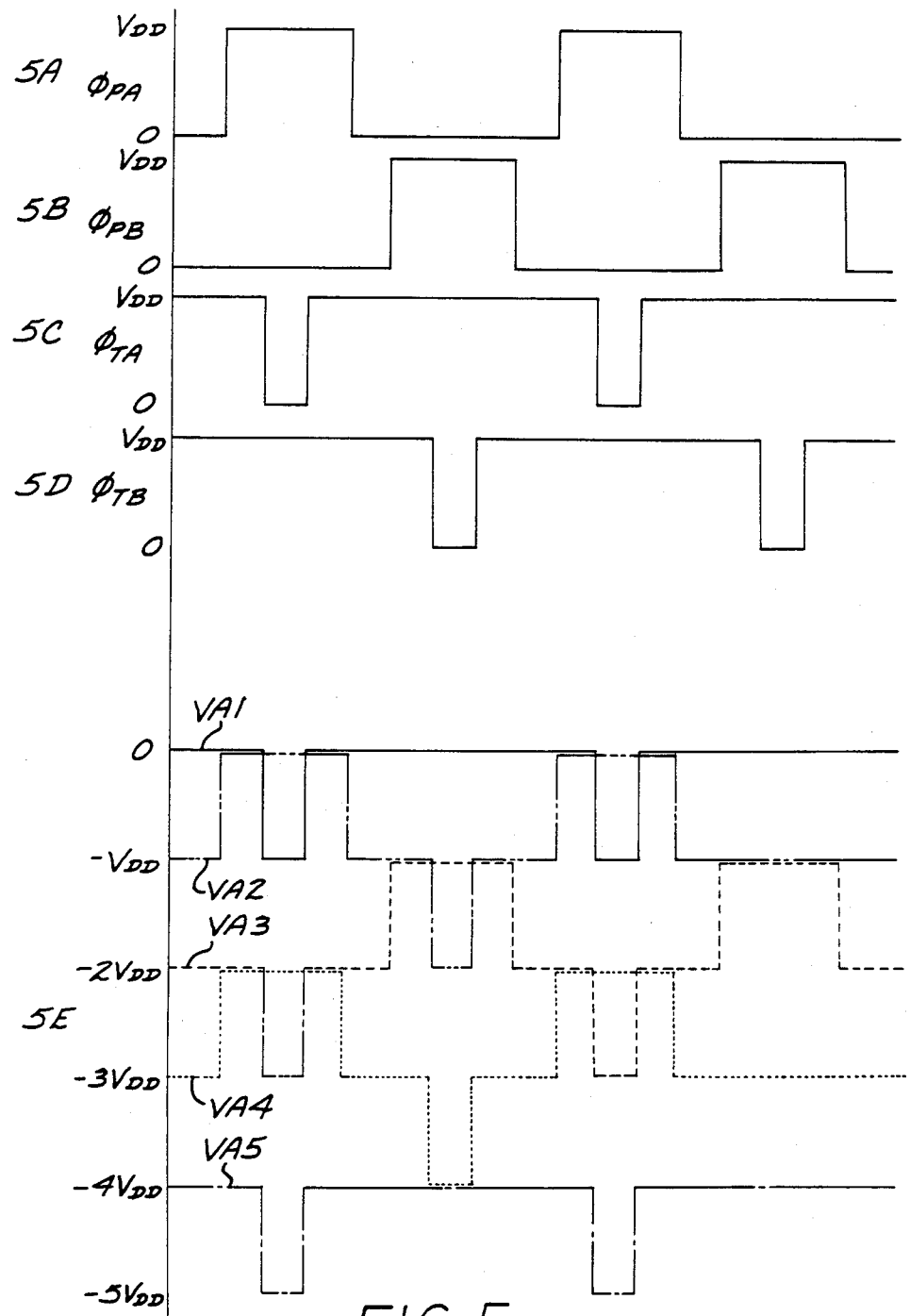

It will be seen by reference to FIGS. 4E–8E that at no time are the rectifying transistors T2N of adjacent stages turned on at the same time. This allows the potential between the input and output nodes of a particular stage N to be equalized at a potential between the input potential at nodes V0(N−1) and V0N. This is indicated in FIG. 4E, with respect to the signals V01 and V02 at time $t_1$. This in turn allows charge to be transferred between the successive stages of the circuit, to pump down the output voltage V05.

Upon application of the clock signals to the circuit, the output voltage does not immediately change to its steady-state value, but rather the voltage decreases in a staircase fashion, with an exponential decay in the rate at which the voltage decreases. The length of time necessary for the current to stabilize depends on the circuit load.

As is evident in FIGS. 4E and 6E, the output voltage at node V05 generated by the multiplier circuit is dependent on the circuit loading. With no resistive load, the steady-state voltage at node V05 is very nearly $-4V_{DD}$, as shown in FIG. 4E. With a resistive load, the output voltage at node V05 is reduced, ad its value depends on the loading.

The preferred embodiment is advantageously employed to develop the programming voltage needed in EEPROM devices to program floating gate transistors employed as memory elements. While the multiplier circuit is only required to generate −12 volts, a four-stage multiplier circuit is employed to reach the 12 volt level more quickly upon circuit startup. A zener diode (not shown) is then provided at the multiplier output to regulate the output voltage at −12 volts.

While the input node of the first stage of the embodiment of FIG. 3 is connected to ground, this is not a requirement for proper operation of the circuit. In fact, the first stage input node may be connected, for example, to a negative supply potential and the multiplier circuit will operate to pump down to an output voltage more negative than this supply potential.

The pump clock signal is not required to have states 0 volts and the positive supply level. The circuit will operate, e.g., with states of $-V_{DD}$ and $+V_{DD}$. Moreover, the positive state may be at a level below $V_{DD}$; however, more stages will be required to reach a desired output potential.

In the embodiment shown in FIG. 3, capacitors C1N have a nominal value of 6 picofarads, capacitors C2N a nominal value of 2 picofarads, and C3N a nominal value of 95 picofarads. The value of C1N is selected to be about ten times the gate capacitance of transistor T2N. The larger the capacitance of C3N, the greater is the current sinking capability of the circuit, but at the expense of chip area.

The effective impedance of the four-stage multiplier circuit of FIG. 3 is proportional to both the pump clock signal frequency and the capacitance C3N. For nominal values of 500 KHz for the clock frequency and 95 picofarads for C3N, the effective impedance is in the range of 100 Kohms.

An improved voltage multiplier circuit has been disclosed. The efficiency ($V_{OUT}/V_{IN}$) of the circuit is nearly unity because charge splitting due to the parasitic capacitors associated with solid state planar processes do not significantly affect the circuit. The current drive has been improved by separating the control node from the output node. By using only p-channel enhancement devices, the layout density is increased (no wells), the fabrication process is simplified, and three are no parasitic vertical NPN bipolar transistors, thus eliminating the possibility of latch-up.

It is understood that the above described embodiment is merely illustrative of the many possible specific embodiments which can represent principles of the present invention. Numerous and varied other arrangements can readily be devised in accordance with these principles by those skilled in the art without departing from the spirit and scope of the invention.

What is claimed:

1. A voltage multiplier circuit having an input node and an output node, comprising:
   transfer clock means for providing a transfer clock signal;
   pump clock means for providing a pump clock signal having high and low levels;
   pump capacitor means for capacitively coupling said pump clock means to said output node;
   switching means for selectively coupling the output node to or isolating it from the input node in response to said transfer clock signal so that said switching means couples said input node to said output node during an interval when said pump clock is at said high level to equalize the potential between said input and output nodes, and to isolate said nodes when the potential at the output node is lower than the potential at the input node.

2. The invention of claim 1 further comprising rectifying means for rectifying the circuit output signal at said output node to provide a substantially constant output voltage under unloaded conditions.

3. The invention of claim 1 wherein said input node is connected to ground.

4. The invention of claim 1 wherein said switching means comprises transistor means having first and second electrodes coupled respectively to said input and output nodes, and a control gate coupled to said transfer clock means.

5. A voltage multiplier circuit having an input node and an output node, comprising:
   transfer clock means for providing a transfer clock signal;
   pump clock means for providing a pump clock signal having high and low levels;
   pump capacitor means for capacitively coupling said pump clock means to said output node; and
   switching means for selectively coupling the output node to the input node in response to said transfer clock signal, said switching means comprising transistor means having first and second electrodes coupled respectively to said input and output nodes, and a control gate capacitively coupled to said transfer clock means;
   whereby said transfer clock signal and said switching means are cooperatively adapted so that said switching means couples said input node to said output node during an interval when said pump clock signal is at said high level so as to equalize the potential between said first and second node, and isolates said input and output nodes when the potential at the output node is lower than the potential at the input node.

6. The invention of claim 5 further comprising resetting means for selectively resetting the potential of said control gate to the potential of said input node.

7. The invention of claim 6 wherein said resetting means comprises a second transistor having source and drain electrodes coupled respectively to the input node and the control gate, and a second control gate capacitively coupled to said pump clock means.

8. The invention of claim 7 further comprising means for selectively resetting the potential of said second control gate to the potential of said input node.

9. The invention of claim 8 wherein said means for selectively resetting the potential of said second control gate comprises third transistor means having first and second electrodes coupling the second control gate to said input node, and a control gate capacitively coupled to said transfer clock means.

10. A voltage multiplier circuit for responding to nonoverlapping first and second pump clock signals, each having high and low levels, and nonoverlapping first and second transfer clock signals, each having high and low levels, an output voltage more negative than the low state of the clock signal, said circuit comprising:
    a plurality of cascaded multiplier stages, each stage having an input node and an output node, the output node of the odd ones of the stages being capacitively coupled to receive said first pump clock signal and the output node of the even ones of the stages being capacitively coupled to receive said second pump clock signal, each stage further comprising:
       switching means responsive to one of said first and second transfer clock signals for selectively coupling the output node to the input node during each interval in the cycle of said respective first and second pump clock signals when said respective pump clock signal is at said high level, and for isolating said input node from said output node when said output node is at a potential lower than the potential of said input node.

11. The invention of claim 10 wherein said first and second clock signals are substantially 180° out of phase.

12. The invention of claim 10 wherein the switching means of each respective stage is controlled by a particular one of non-overlapping first and second transfer clock signals, said first transfer clock signals being applied to the switching means of the odd stages so as to cause said switching means to couple the input node to the output node of the respective stage during the interval when the respective first pump clock signal applied to the output node is at its high state, and said second transfer clock signal being applied to the switching means of the even stages so as to cause said switching means of said even stages to couple the input node to the output node of the respective stage during the interval when the respective second pump clock signal applied to the output node is at its high state.

13. The invention of claim 5 wherein the switching means of each respective stage comprises a transistor whose control gate is coupled to receive its respective transfer clock signal and having first and second electrodes coupled to respective ones of the input and output nodes.

14. The invention of claim 13 wherein the respective transfer clock is capacitively coupled to the control gate of the transistor means of each respective stage, and each stage further comprises means for selectively resetting the potential of said respective control gate to the potential of the respective input node.

15. The invention of claim 14 wherein said means for selectively resetting the potential comprises a second transistor having first and second electrodes coupled to said input node and said control gate, and having second control gate means capacitively coupled to its respective pump clock signal.

16. A voltage multiplier for integrated circuits for generating an output voltage from a pump clock signal having periodic high and low level, comprising at least one stage, each stage comprising:
pump capacitor means for coupling said pump clock signal to the output node of the stage;
field effect transistor means having source and drain electrodes coupling said output node to the input node of the stage, and a control gate coupled to receive a transfer clock signal;
the transfer clock signal being cooperatively arranged with said pump clock signal so as to gate the transistor to the conductive level during the time intervals when said pump clock signal is at its high level to equalize the potential at said input and output nodes, and so that the transistor is in the nonconductive level when the pump clock signal is at its low level;
whereby each stage of said multiplier circuit is adapted to generate a potential at the output node substantially equal to $-(V_H-V_{IN})$, where $V_{IN}$ represents the potential at the input node and $V_H$ represents the potential of the pump clock signal at the high level.

17. The invention of claim 16 wherein transfer clock signal is capacitively coupled to said control gate of said transistor, and further comprising means for setting the potential at the control gate to the potential at the input node when said pump clock signal is at the low state.

18. The invention of claim 17 wherein means for setting the potential at the control gate comprises second field effect transistor means having source and drain electrodes respectively coupled to said control gate and said input node, and a second control gate capacitively coupled to the pump clock signal.

19. The invention of claim 18 wherein said second control gate is coupled to receive said pump clock signal by a second capacitor means, whereby said second control gate is isolated from said output node.

20. The invention of claim 16 wherein said voltage multiplier comprises a plurality of N stages, the input node of the first stage being connected to ground, and the input node of each succeeding stage being coupled to the output node of the preceding stage, and wherein adjacent ones of said stages are clocked by non-overlapping pump and transfer clock signals.

21. The invention of claim 20 further comprising an output rectifier stage coupled to the output node of the last stage N, whereby said circuit is adapted to generate an output voltage of $-NV_H$ under steady-state, capacitively loaded conditions.

22. The invention of claim 16 wherein said transfer clock signals has first and second states, the first state at ground potential and the second state at a supply potential for the integrated circuit.

* * * * *